United States Patent
Mulckhuyse et al.

(10) Patent No.: US 9,482,963 B2
(45) Date of Patent: Nov. 1, 2016

(54) METHOD OF CONTROLLING A PATTERNING DEVICE IN A LITHOGRAPHIC APPARATUS, DEVICE MANUFACTURING METHOD AND LITHOGRAPHIC APPARATUS

(75) Inventors: Wouter Frans Willem Mulckhuyse, Bussum (NL); Pieter Willem Herman De Jager, Middelbeers (NL); Erwin John Van Zwet, Pijnacker (NL)

(73) Assignee: ASML NETHERLANDS B.V., Veldhoven (NL)

( * ) Notice: Subject to any disclaimer, the term of this patent is extended or adjusted under 35 U.S.C. 154(b) by 422 days.

(21) Appl. No.: 13/885,066

(22) PCT Filed: Dec. 2, 2011

(86) PCT No.: PCT/EP2011/071610
§ 371 (c)(1),
(2), (4) Date: May 13, 2013

(87) PCT Pub. No.: WO2012/084457
PCT Pub. Date: Jun. 28, 2012

(65) Prior Publication Data
US 2013/0242277 A1     Sep. 19, 2013

Related U.S. Application Data

(60) Provisional application No. 61/424,932, filed on Dec. 20, 2010.

(51) Int. Cl.
*G03F 7/20*     (2006.01)

(52) U.S. Cl.
CPC ......... *G03F 7/70508* (2013.01); *G03F 7/7055* (2013.01); *G03F 7/70291* (2013.01); *G03F 7/70433* (2013.01); *G03F 7/70558* (2013.01)

(58) Field of Classification Search
CPC ........... G03F 7/70291; G03F 7/70433; G03F 7/70508; G03F 7/7055; G03F 7/70558
See application file for complete search history.

(56) References Cited

U.S. PATENT DOCUMENTS 6,002,466 A    12/1999  Brauch et al.
6,160,921 A *  12/2000  Marcu ........................ 382/252
(Continued)

FOREIGN PATENT DOCUMENTS

JP    2006-527418    11/2006
JP    2006-338000    12/2006
(Continued)

OTHER PUBLICATIONS

International Preliminary Report on Patentability mailed Jul. 4, 2013 in corresponding International Patent Application No. PCT/EP2011/071610.
(Continued)

*Primary Examiner* — Michelle M Iacoletti
(74) *Attorney, Agent, or Firm* — Pillsbury Winthrop Shaw Pittman LLP

(57) ABSTRACT

A system for controlling a patterning device in a lithographic apparatus using a patterning device having individually controllable elements that may only be set to two states. The method includes converting a representation of a pattern to be formed on the substrate into a plurality of area intensity signals, each corresponding to a radiation intensity level required to be set in a respective area of the patterning device in order to provide the desired pattern on the substrate and a separate step of converting each of the area intensity signals into control signals for a plurality of individually controllable elements that each correspond to the area of the patterning device.

20 Claims, 6 Drawing Sheets

(56) References Cited

U.S. PATENT DOCUMENTS

| | | | |
|---|---|---|---|
| 7,014,986 | B2 | 3/2006 | Sawano et al. |
| 7,477,772 | B2 | 1/2009 | Makarovic et al. |
| 2005/0231651 | A1* | 10/2005 | Myers et al. ............... 348/744 |
| 2006/0269116 | A1 | 11/2006 | Makarovic et al. |
| 2008/0073588 | A1 | 3/2008 | Kruit et al. |
| 2008/0074700 | A1* | 3/2008 | Olsson et al. ............... 358/3.01 |

FOREIGN PATENT DOCUMENTS

| | | |
|---|---|---|
| JP | 2007-011290 | 1/2007 |
| JP | 2010-122526 | 6/2010 |
| TW | 200745768 | 12/2007 |
| WO | 2010/134017 | 11/2010 |
| WO | 2010/134018 | 11/2010 |

OTHER PUBLICATIONS

Japanese Office Action dated Jul. 1, 2014 in corresponding Japanese Patent Application No. 2013-543630.

International Search Report and Written Opinion mailed Jun. 6, 2012 in corresponding International Patent Application No. PCT/EP2011/071610.

M.J. Wieland et al., "Throughput enhancement technique for MAPPER maskless lithography," Proc. of SPIE, vol. 7637, pp. 76371Z-76371Z-11 (Jan. 1, 2010).

E.A. Hakkennes et al., "Demonstration of real-time pattern correction for high-throughput maskless lithography," Proc. of SPIE, vol. 7970, pp. 79701A-79701A-11 (Jan. 1, 2011).

Taiwanese Office Action dated Feb. 26, 2014 in corresponding Taiwan Patent Application No. 100146565.

* cited by examiner

METHOD OF CONTROLLING A PATTERNING DEVICE IN A LITHOGRAPHIC APPARATUS, DEVICE MANUFACTURING METHOD AND LITHOGRAPHIC APPARATUS

CROSS-REFERENCE TO RELATED APPLICATIONS

This application is the U.S. national phase entry of PCT Patent Application No. PCT/EP2011/071610, filed on Dec. 2, 2011, which claims the benefit of priority of U.S. provisional application 61/424,932, which was filed on Dec. 20, 2010 and which is incorporated herein in its entirety by reference.

FIELD

The present invention relates to a method of controlling a patterning device in a lithographic apparatus, a method for manufacturing a device and a lithographic apparatus.

BACKGROUND

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

In lithography using a patterning device comprised of an array of individually controllable elements, it has been known to use patterning devices in which each of the individually controllable elements may be set either to a first state, in which radiation is transmitted to the substrate, or a second state, in which radiation is not transmitted to the substrate. Such a device may be referred to as a black and white contrast device.

Using such a device, a pattern may easily be set by selecting each individually controllable element to be in either the first state or the second state according to the position within the pattern. It is therefore computationally relatively straightforward to convert a desired pattern into control signals for the patterning device. Furthermore, the arrangement may be used in a similar manner to a mask-based system. For example, in a corresponding manner to a mask-based system, for a desired pattern to be formed on a substrate, the pattern may be prepared using known optical proximity correction (OPC) techniques, and once the pattern is determined, the control signals for the patterning device generated.

SUMMARY

However, the position of an edge of a feature within the pattern is adjusted by changing the state of a row of individually controllable elements. Accordingly, a row of individually controllable elements are provided corresponding to each possible position of the edge of the feature. For example, the smallest increment in line width and the smallest shift in the position of the edge of a feature, such as a line, may typically be 1/20 of the critical dimension (CD). In order to provide this with a black and white contrast device, 400 individually controllable elements (20×20) for each unit area on the substrate of the size of the critical dimension would be provided.

Accordingly, for a system using a black and white contrast device, a very large number of individually controllable elements are provided in order to transfer a pattern to a sufficiently large area of the substrate at any one time to ensure economic throughput of the lithographic apparatus.

However, there is a limit to the number of individually controllable elements that can be provided in a single device. This is partly due to the difficulty in providing a device with ever-larger numbers of individually controllable elements that all function correctly, namely the yield of the manufacturing process for the device, and partly due to difficulty in providing control signals to a large number of individually controllable elements. Accordingly, an arrangement may be provided that includes, for example, multiple optical columns that may each include one or more patterning devices and a projection system to simultaneously project images onto the substrate. However, the greater the number of optical columns, the greater the cost of goods of the lithographic apparatus.

Accordingly, a patterning device having individually controllable elements that may be set to more than two states, as discussed above, may be used. Such individually controllable elements may set the intensity of the radiation directed to the substrate to one of multiple levels. Such a patterning device may be referred to as a grayscale contrast device. In one example, each individually controllable element may be set to one of 256 grayscale levels, using 8 bit addressing.

An advantage of using a grayscale system is that the position of the edge of a feature may be adjusted by changing the grayscale level of an individually controllable element corresponding to the edge of the feature. By changing the grayscale level, the profile of the dose received at the substrate changes. In turn, the point at which the dose received at the substrate crosses the resist threshold is adjusted, correspondingly adjusting the position of the edge of the feature. Consequently, in such a system it may not be necessary to have an individually controllable element corresponding to each possible position of the edge of the feature. For the example discussed above, in which each individually controllable element is addressed by 8 bit data, only seven individually controllable elements may be needed for each unit area on the substrate of the size of critical dimension.

Accordingly, the use of grayscale individually controllable elements may reduce the total number of individually controllable elements used to form a given image area on the substrate at a given critical dimension. In turn, for example, fewer optical columns may be required than for a system using a black and white contrast device.

The data processing for generating the control signals for the individually controllable elements is significantly more complex for a system using a grayscale contrast device. Accordingly, significant computational resources are used, again increasing the cost of goods of the lithographic apparatus.

Furthermore, in such an arrangement, it may be difficult to compensate for errors introduced by individually controllable elements that become non-responsive. Accordingly, the computational complexity may be significantly further increased in order to provide compensation for such errors and/or it may be necessary to ensure that very few individually controllable elements are non-responsive. This, in turn, may require that the patterning device is replaced relatively frequently when the number of non-responsive individually controllable elements exceeds a threshold and/or may increase the cost of the patterning devices if the patterning device should have very few non-responsive individually controllable elements.

It is therefore desirable, for example, to provide a new system that overcomes one or more of the disadvantages described herein or other disadvantages.

In an embodiment, there is provided a method of controlling a patterning device in a lithographic apparatus configured to form an image on a substrate, in which the patterning device comprises a plurality of individually controllable elements that each may be set to either a first state, in which radiation is directed to a corresponding portion of the substrate, or a second state, in which radiation is not directed to a corresponding portion of the substrate, the method comprising: converting a representation of a pattern desired to be formed on a substrate into a plurality of area intensity signals, each corresponding to a radiation intensity level to be set in a respective area of the patterning device such that the effect at the substrate of the respective radiation intensity levels being set in each area of the patterning device is the desired pattern; converting each of the area intensity signals into a plurality of control signals for a respective plurality of individually controllable elements corresponding to the area of the patterning device such that the individually controllable elements are set to appropriate states in order that the combined effect of setting all of the individually controllable elements in the area to the states in use is to provide the radiation intensity level for the area specified in the area intensity signal; and setting each of the individually controllable elements according to its associated control signal.

In an embodiment, there is provided a device manufacturing method comprising: using a patterning device comprising an array of individually controllable elements to impart a pattern to a beam of radiation; and projecting the beam of radiation onto a substrate; wherein each of the individually controllable elements may be set to either a first state, in which radiation is directed to a corresponding portion of the substrate, or a second state, in which radiation is not directed to a corresponding portion of the substrate; and the patterning device is controlled according to the above method.

In an embodiment, there is provided a lithographic apparatus, comprising: a patterning device comprising a plurality of individually controllable elements used to impart a pattern to a beam of radiation; a projection system, configured to project the beam of radiation onto a substrate; and a controller, configured to: convert a representation of a pattern desired to be formed on a substrate into a plurality of area intensity signals, each corresponding to a radiation intensity level to be set in a respective area of the patterning device such that the effect at the substrate of the respective radiation intensity levels being set in each area of the patterning device is the desired pattern; convert each of the area intensity signals into a plurality of control signals for a respective plurality of individually controllable elements corresponding to the area of the patterning device such that the individually controllable elements are set to appropriate states in order that the combined effect of setting all of the individually controllable elements in the area to the states in use is to provide the radiation intensity level for the area; and provide the control signals to the individually controllable elements to set the state of each of the individually controllable elements.

Further embodiments, features, and advantages of embodiments of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Embodiments of the present invention will now be described with reference to the accompanying drawings. In the drawings, like reference numbers can indicate identical or functionally similar elements.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
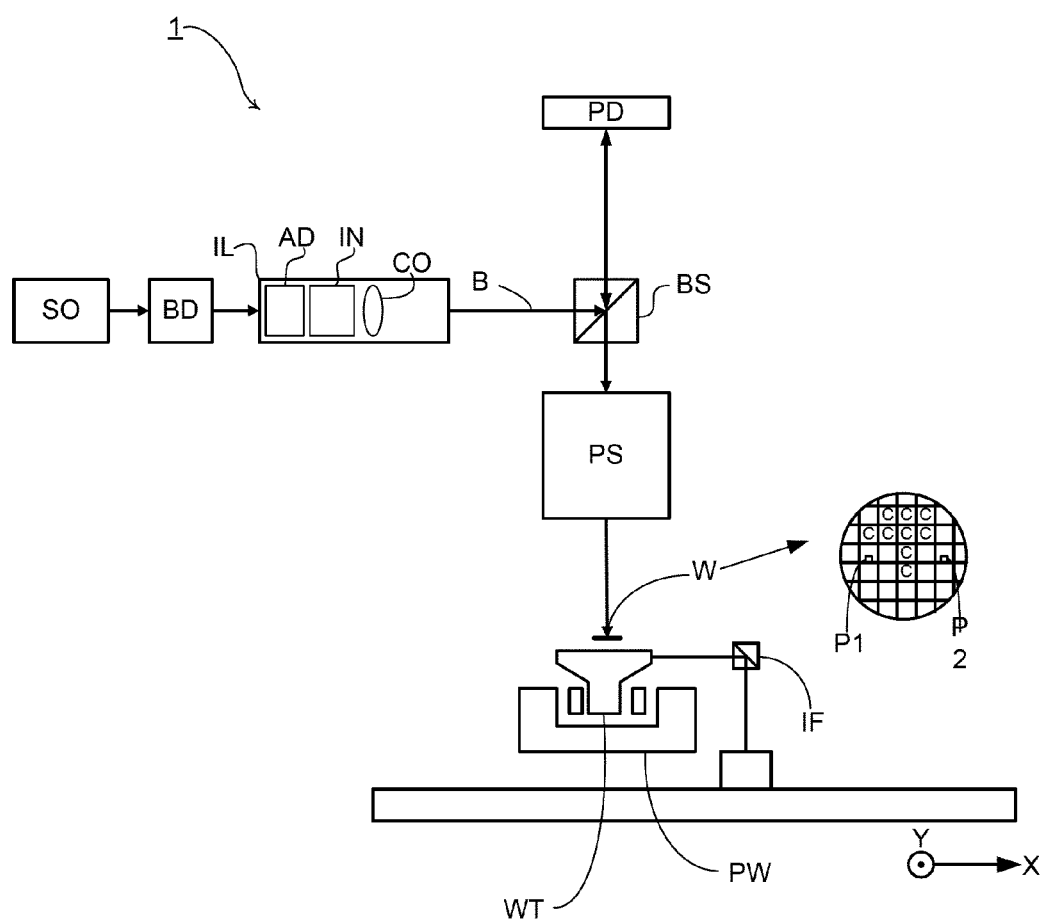
FIGS. 1 and 2 depict a lithographic apparatus according to various embodiments of the present invention.

FIG. 1 schematically depicts a lithographic apparatus 1 according to one embodiment of the invention. The apparatus comprises an illumination system IL, a patterning device PD, a substrate table WT, and a projection system PS. The illumination system (illuminator) IL is configured to condition a radiation beam B (e.g., UV radiation) from a source SO.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system IL can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The device can be a static patterning device (e.g., a mask or reticle) or a dynamic patterning device (e.g., an array of programmable elements). For brevity, most of the description will be in terms of a dynamic patterning device. However it is to be appreciated that a static pattern device can be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. A patterning device whose pattern is programmable with the aid of electronics (e.g., a computer), such as a patterning device comprising a plurality of programmable elements (e.g., all the devices mentioned in the previous sentence except for the reticle), is referred to herein as a "contrast device." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident radiation as diffracted radiation, whereas unaddressed areas reflect incident radiation as undiffracted radiation. Using an appropriate spatial filter, the undiffracted radiation can be filtered out of the reflected beam, leaving only the diffracted radiation to reach the substrate. In this manner, the beam becomes patterned according to the addressing pattern of the matrix-addressable surface. It will be appreciated that, as an alternative, the filter can filter out the diffracted radiation, leaving the undiffracted radiation to reach the substrate.

An array of diffractive optical MEMS devices (micro-electro-mechanical system devices) can be used in a corresponding manner. In one example, a diffractive optical MEMS device is comprised of a plurality of reflective ribbons that can be deformed relative to one another to form a grating that reflects incident radiation as diffracted radiation.

A further alternative example of a programmable mirror array employs a matrix arrangement of tiny mirrors, each of which can be individually tilted about an axis by applying a suitable localized electric field, or by employing a piezoelectric actuator. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronics.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one selected from: a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
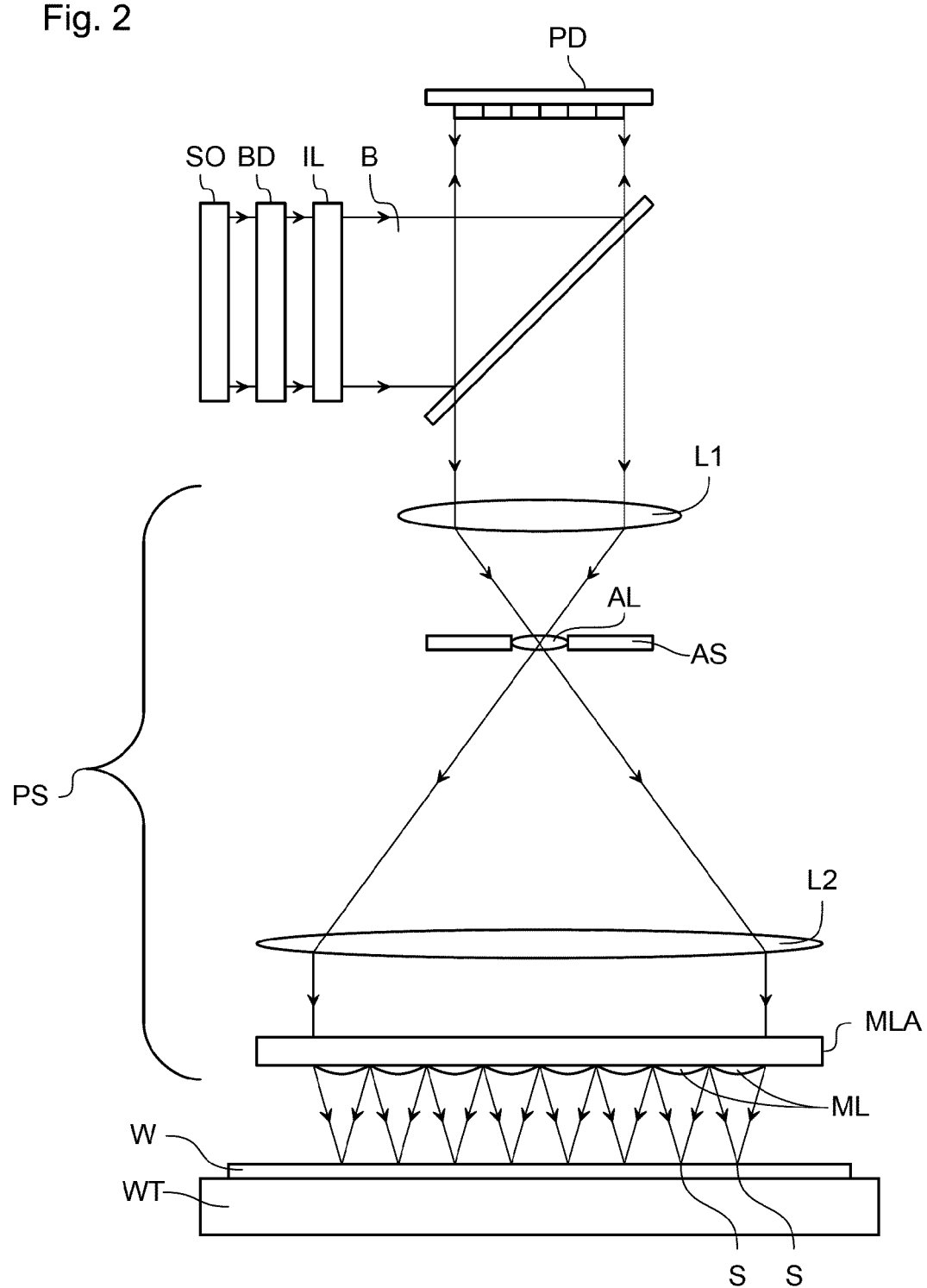

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) via a beam delivery system BD and the illuminator IL and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, a positioner for the array of individually controllable elements can be used to correct accurately the position of the patterning device PD with respect to the path of the beam B, e.g., during a scan.

In one example, movement of the substrate table WT is realized with the aid of a long-stroke module (coarse positioning) and a short-stroke module (fine positioning), which are not explicitly depicted in FIG. 1. In one example, the apparatus is absent at least a short stroke module to move substrate table WT. A similar system can also be used to position the array of individually controllable elements. It will be appreciated that the beam B can alternatively or additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system to scan the substrate W across it at a substantially constant velocity.

As shown in FIG. 1, the beam of radiation B can be directed to the patterning device PD by means of a partially reflective optical element or beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the partially reflective optical element or beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edge of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundary than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the desired pattern on the substrate, each of the individually controllable elements in the patterning device is set to the applicable state at each stage during the exposure process. Therefore, control signals, representing the applicable states, are transmitted to each of the individually controllable elements. In one example, the lithographic apparatus includes a controller that generates the control signals. The pattern to be formed on the substrate can be provided to the lithographic apparatus in a vector-defined format, such as GDSII. To convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a radiation dose map (namely a radiation dose profile across the substrate); converting a radiation dose map into radiation intensity values for each individually controllable element; and converting the radiation intensity values for each individually controllable element into corresponding control signals.

FIG. 2 depicts an arrangement of a lithographic apparatus according to an embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens ML focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
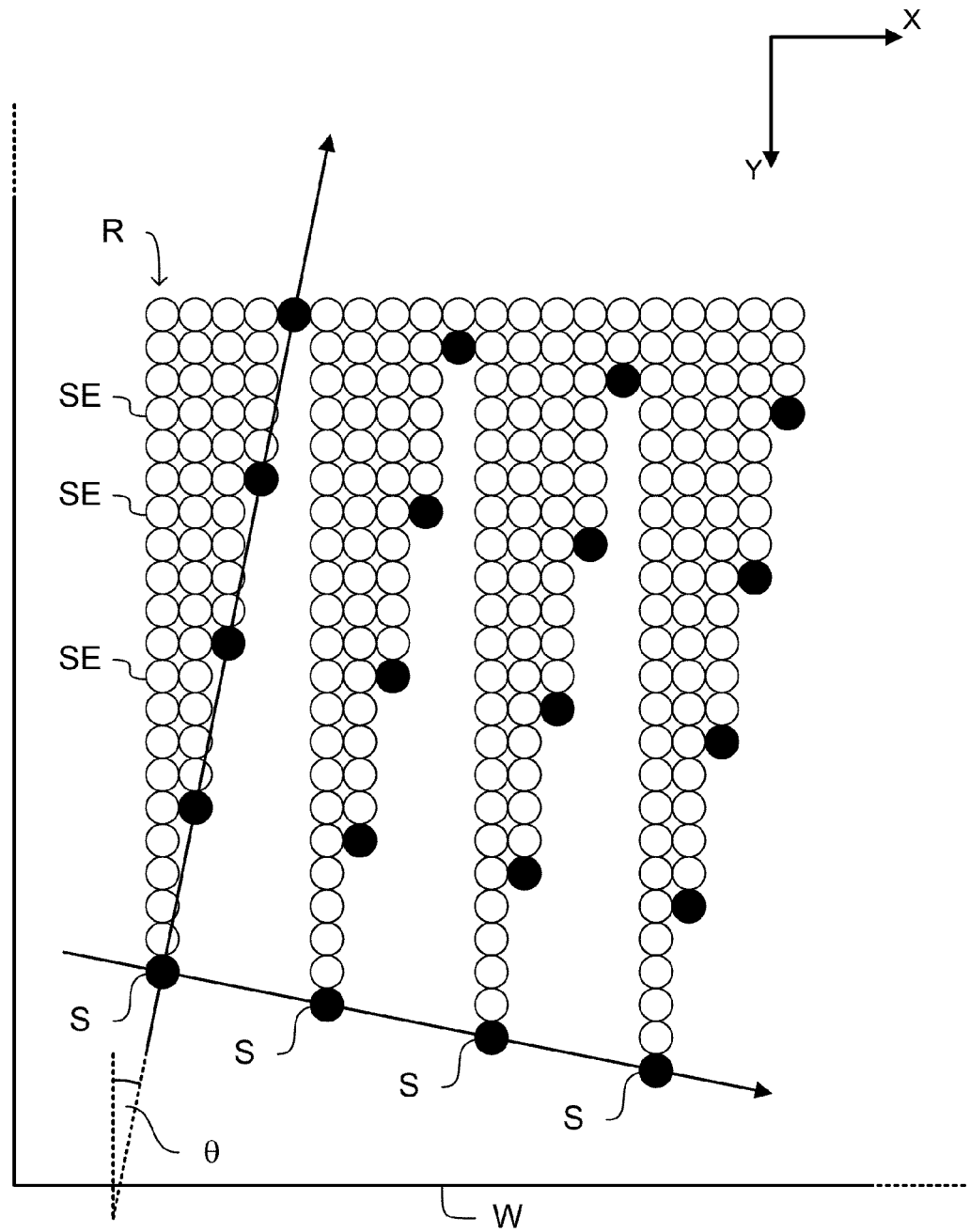
FIG. 3 depicts a mode of transferring a pattern to a substrate using an embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed herein.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
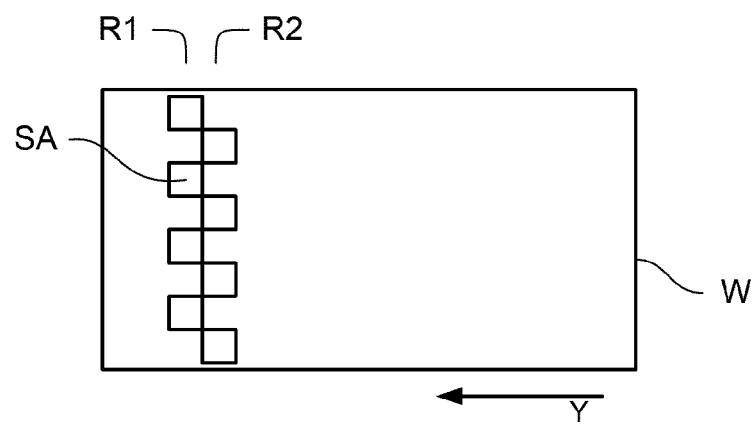
FIG. 4 depicts an arrangement of optical engines, according to an embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

In one embodiment, the radiation source SO supplying the illuminator is a continuous radiation source, in particular a lamp, e.g., an Hg lamp. In combination with this continuous source SO the individually controllable elements are switched ON and OFF at a rate of, e.g., at least about 50 kHz, at least about 80 kHz, or at least about 100kHz.

An embodiment of the present invention provides a lithographic system having a patterning device comprising a plurality of individually controllable elements that may be set to one of two states, namely a first state, in which radiation is directed to a corresponding portion of the substrate, or a second state, in which radiation is not directed to a corresponding portion of the substrate. Accordingly, an embodiment of the invention may be used with a known black and white contrast device. However, such a patterning device is used in a different way from that which is conventionally known.

Figure 5:
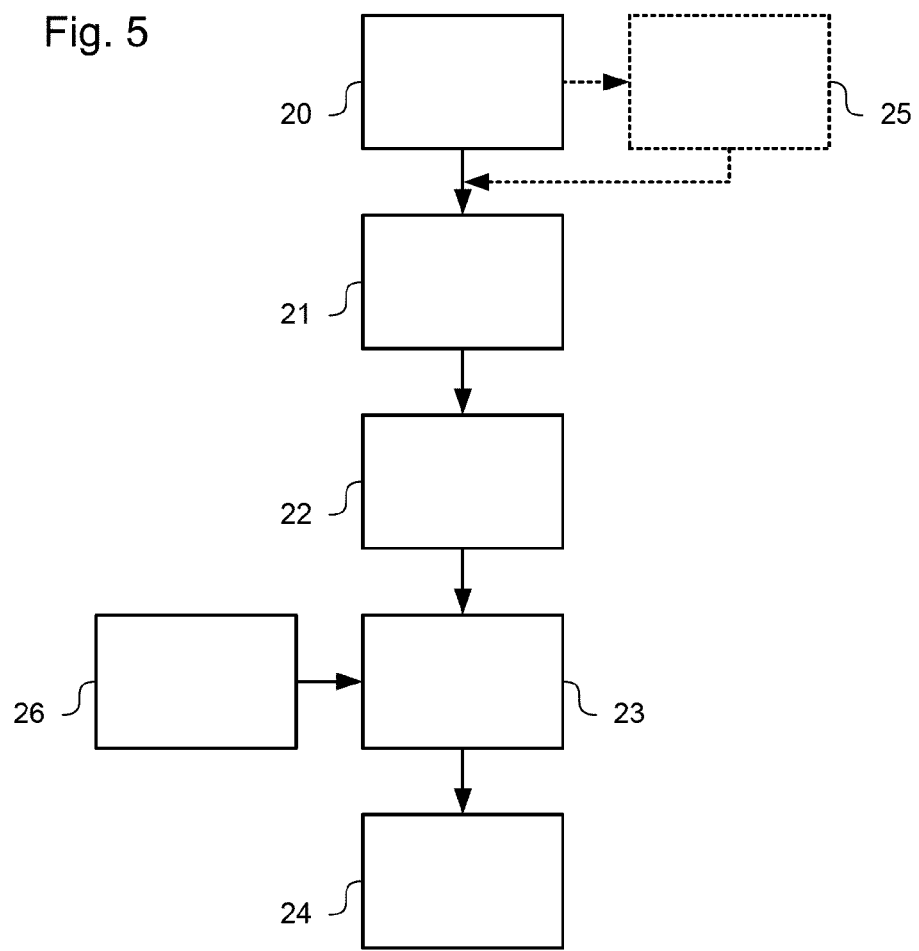
FIG. 5 depicts an arrangement of a process according to an embodiment to determine control signals for controlling a patterning device.

FIG. 5 schematically depicts a process according to an embodiment of the invention for determining the control signals required for the patterning device from a representation of a pattern desired to be formed on the substrate.

Figure 6:
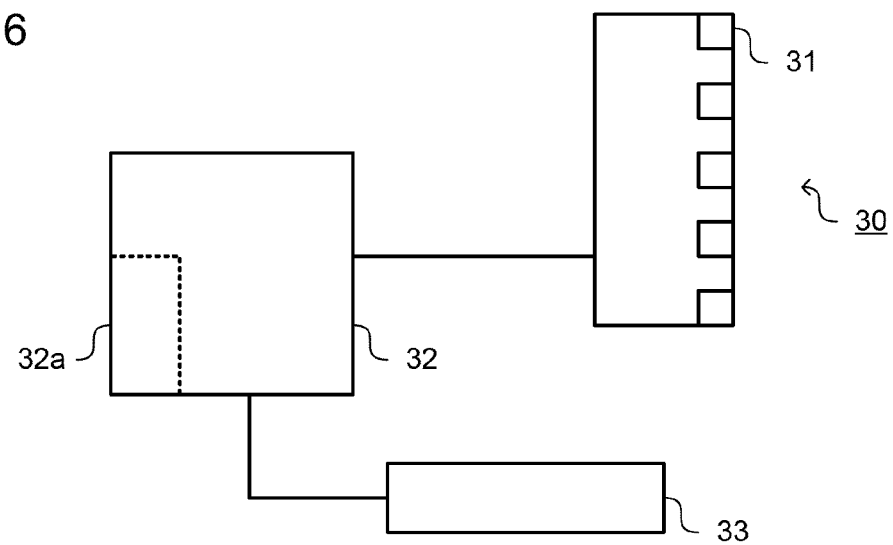
FIG. 6 depicts a schematic arrangement of a control system of a lithographic apparatus according to an embodiment.

FIG. 6 schematically depicts elements of the system for this process. In particular, as shown, a lithographic apparatus may include a controller 32 for performing the process, namely determining the control signals for the individually controllable elements 31.

As represented in FIG. 5, the pattern 20 desired to be formed on the substrate W forms the starting point of the process. In a first step 21 of the process, a representation of the pattern 20 intended to be formed on the substrate is converted into a plurality of area intensity signals 22. Each of the area intensity signals corresponds to a radiation intensity level that would be set in each respective area of the patterning device 30 in order that the effect at the substrate of all of the respective radiation intensity levels being set in each area of the patterning device would be the desired pattern 20. In other words, the area intensity signals correspond to the setting that would be used if one individually controllable element were provided at each area on the patterning device 30 and the patterning device 30 were configured to use grayscale, namely in which each of the individually controllable elements were able to be set to a plurality of different radiation intensity levels. Accordingly, this process may correspond to known a process for generating a control signal for a grayscale contrast device.

In a subsequent step 23, the area intensity signals 22 are each converted into a plurality of control signals 24 for setting a plurality of individually controllable elements 31.

In particular, as discussed above, each area intensity signal 22 relates to a radiation intensity for an area of the patterning device 30. Each such area includes a plurality of individually controllable elements 31 that each may be set to one of two states, as discussed above. Accordingly, step 23 converts each of the area intensity signals 22 into the control signals 24 used to set each of the individually controllable elements 31 in the area of the patterning device 30 associated with the area intensity signal.

The process 23 for converting the area intensity signals into the plurality of control signals for respective individually controllable elements is arranged such that the combined effect of setting each of the individually controllable elements in the area of the patterning device 30 to their respective states is such that the total radiation intensity for that area corresponds to the radiation intensity specified by the corresponding area intensity signal. The control signals 24 for the individually controllable elements may then be provided to the individually controllable elements 31 by the controller 32 in order to set the patterning device 30.

The arrangement of this embodiment has one or more advantages compared to the previously known maskless lithographic systems. In particular, because a plurality of black and white individually controllable elements are used to mimic the effect of a single grayscale individually controllable element, fewer individually controllable elements are used for each unit area on the substrate of the size of the critical dimension than would be used for a conventional maskless lithography system using a black and white contrast device.

This may be understood by considering the fact that, in a conventional system using a black and white contrast device, only the individually controllable elements corresponding to the edge of a feature are used to adjust the position of the edge of the feature, namely by switching the individually controllable elements in a row between the two available states.

In contrast, in the arrangement of this embodiment, changing the state of any one of the individually controllable elements within an area on the patterning device may be used to adjust the position of the edge of the feature, namely not just the individually controllable element at the feature boundary. Accordingly, this possibility to fine tune the position of the edge of a feature using individually controllable elements away from the intended edge of the feature has the result that it may not be necessary to provide rows of individually controllable elements corresponding to each possible position of the edge of the feature. Accordingly, the number of individually controllable elements for each unit area on the substrate of the size of the critical dimension is reduced. In turn, this may reduce the total number of optical columns, reducing the cost of goods of the lithographic apparatus.

In an embodiment of the invention, as depicted in FIG. 5, the process may also include a step 25 of modifying the representation of the pattern 20 desired to be formed on the substrate to take account of distortions of the substrate and/or position errors of the substrate. For example, during the process of exposing the pattern on the substrate, the substrate may be inspected by a sensor 33 in order to measure distortions of the substrate from a nominal substrate geometry and/or position errors of the substrate. By modifying the pattern to be formed on the substrate in a manner that corresponds to the measured distortions and/or position errors of the substrate, the pattern being projected onto the substrate in a given part of a process to form a device on the substrate may be accurately aligned with layers of the device previously formed on the substrate.

As shown in FIG. 5, the separate step 25 may be provided to modify the representation of the pattern 20 desired to be formed on the substrate using the data from the sensor 33 concerning the distortion of the substrate prior to the step of converting the representation of the pattern to be formed on the substrate into the plurality of area intensity signals. Alternatively, however, the measurement of the distortion of the substrate by the sensor 33 may be taken into account in the process 21 for converting the representation of the pattern desired to be formed on the substrate into the plurality of area intensity signals.

It will therefore be appreciated that a lithographic system according to this embodiment may advantageously take into account distortions of the substrate in order to improve the overlay accuracy of a subsequently formed image relative to previously formed layers of a device on a substrate. Such a possibility may not be provided in a conventionally known system for using a black and white contrast device which, as discussed above, may be limited to a previously determined pattern and therefore may not easily be modified according to substrate distortion.

In an embodiment of the invention, as shown in FIG. 5, during the step 23 of converting the area intensity signals 22 into the plurality of control signals 24 for each of the individually controllable elements 31, information 26 regarding non-responsive individually controllable elements 31 may be taken into account. Accordingly, for example, if an individually controllable element is known to be permanently in one of the two possible states for the individually controllable element, regardless of the control signal applied to it, the step 23 of converting the control signals for the corresponding plurality of individually controllable elements may be configured such that it assumes that the non-responsive individually controllable element 31 will remain in that state.

For example, the process may be arranged such that, if half of the individually controllable elements 31 in a given area of the patterning device 30 are to be set to the first state, any non-responsive individually controllable elements 31 that are known to be permanently in the first state are included in the group of individually controllable elements 31 to be set to the first state.

Accordingly, such an arrangement may, by means of relatively simple processing, such as discussed herein in further detail, take into account the known state of non-responsive individually controllable elements. In particular, the computational complexity of such a system may not be significantly increased. This is in comparison to a previously known system using a grayscale contrast device, in which it is typically not possible to compensate for non-responsive individually controllable elements. Furthermore, in previously known systems using a grayscale contrast device that can take account of non-responsive individually controllable elements, the computational complexity is significantly increased.

Figure 7:
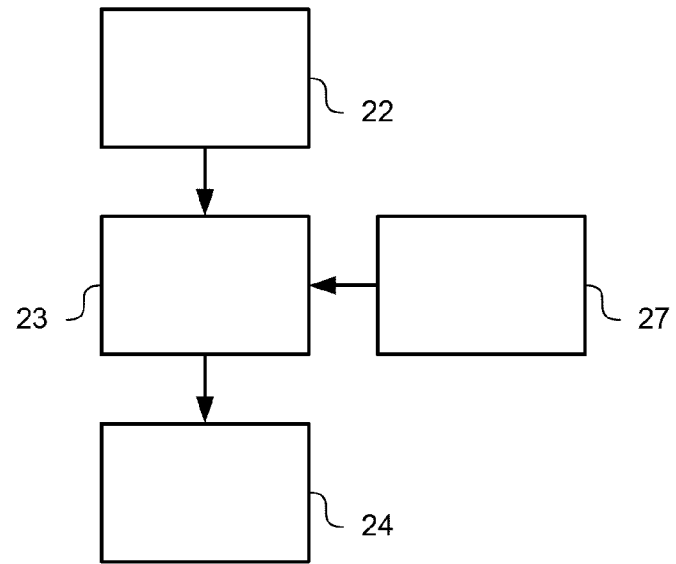
FIG. 7 depicts a detail of the process of FIG. 5 according to an embodiment.

FIG. 7 schematically depicts a process that may be used in an embodiment in order to convert the area intensity signals 22 into the plurality of control signals 24 for the corresponding set of individually controllable elements 31.

In order to convert the area intensity signals, the process 23 uses a series of look-up tables 27. These may be stored, for example, in a memory 32a that is part of the controller 32. The look-up tables 27 may, for example, specify the plurality of control signals for a set of individually controllable elements corresponding to an area on the patterning device 30 that are used for each possible setting of the area intensity signals 22. The set of control signals may be generated by fitting the state of the corresponding plurality of individually controllable elements to a desired effective point spread function for an area on the patterning device 30 for each desired setting of the area intensity signals 22.

Accordingly, by selecting from the look-up tables 27 the appropriate set of control signals for the individually controllable elements 31 associated with a particular area intensity signal 22, the process may convert the area intensity signals 22 into the plurality of control signals 24. Such a process may be performed with relatively little computational complexity.

In an embodiment, the look-up tables 27 may be common for all of the areas of the patterning device 30.

In an embodiment, a respective set of look-up tables 27 may be provided for each different area of the patterning device 30. In such an arrangement, the look-up tables 27 may be selected in order to take account of any non-responsive individually controllable elements 31 within each area of the patterning device 30. Accordingly, for example, different distributions of individually controllable elements 31 that are to be set to the first state, for example, may be used for different areas of the patterning device 30 for the same area intensity signal. Accordingly, the impact of non-responsive individually controllable elements 31 may be reduced or minimized.

Alternatively or additionally, the sets of control signals for each different area of the patterning device 30 may take into account known position errors of the individually controllable elements 31. In this way the process for generating the area intensity signals 22 discussed above may not need to be capable of taking into account spot position errors.

It will be appreciated that in an embodiment, the look-up tables 27 may be periodically updated to take account of newly identified non-responsive individually controllable elements and/or newly identified spot position errors, if required.

In an embodiment, the look-up tables 27 may alternatively or additionally be configured to take into account pattern gradient information. Accordingly, for example, a set of control signals for an area of the patterning device 30 may be selected such that the resulting point spread function that effectively results for the area of the patterning device 30 is appropriate, possibly optimized, with respect to its position in the pattern. For example, for a given value of an area intensity signal 22, a different set of control signals for an area of the patterning device 30 may be selected from the look-up tables 27 for an edge on one side of a pattern feature compared to an edge on the opposite side of a pattern feature.

Figure 8:
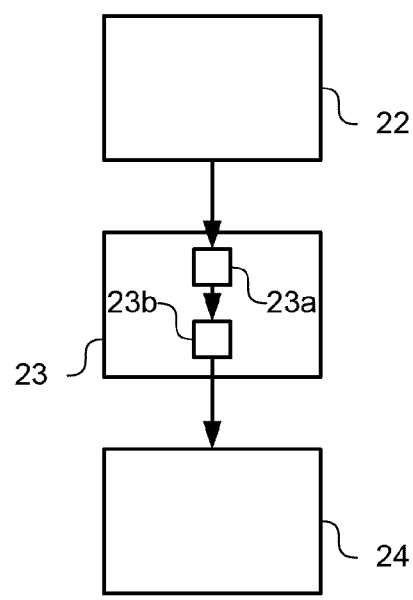
FIG. 8 depicts an alternative arrangement of a detail of the process of FIG. 5 according to an embodiment.

FIG. 8 depicts schematically a process of a further embodiment for converting area intensity signals 22 into a respective plurality of control signals 24 for the corresponding individually controllable elements of an area of the patterning device 30.

In a first part 23*a* of the conversion process 23, the number of individually controllable elements 31 within an area of the patterning device that should be set to the first state in order that the area of the patterning device 30 directs to the substrate the radiation intensity designated by the area intensity signal 22 is determined. In a second part 23*b* of the conversion process 23, the determined number of individually controllable elements 31 set to the first state may be distributed across the area of the patterning device 30 in order to generate the control signals 24 for the plurality of individually controllable elements 31 within the area.

The distribution process 23*b* may be performed by any number of ways. For example, the distribution process may be random, pseudo-random or an algorithm may be provided in order to substantially evenly distribute the individually controllable elements 31 set to the first state across the area of the patterning device 30. It will be appreciated that other distribution processes may be used. It will also be appreciated that the distribution process 23*b* may take into account non-responsive individually controllable elements 31 in each area of the patterning device 30.

It should also be appreciated that a plurality of different processes may be used in order to convert the representation of the pattern desired to be formed on the substrate into the plurality of area intensity signals 22, as discussed above.

In an embodiment, the controller 32 may use a representation of the distribution of radiation intensity across the substrate derived from each area of the patterning device, commonly known as a point spread function. For each point on the substrate, the radiation intensity desired at the substrate is determined from the pattern desired to be formed on the substrate. From this, the radiation intensity levels to be set at each area of the patterning device may be calculated such that the sum of the contributions from each area, taking into account the respective point spread functions, equals the radiation intensity desired at the substrate.

It will be appreciated that the calculation to determine a best solution may be computationally intensive. However, it will be appreciated that the greatest contribution to the intensity of radiation received at a point on the substrate is provided by a single corresponding point on the patterning device 30. Furthermore, the further from this point on the patterning device, the smaller the contribution to the intensity received at the substrate. Accordingly, a good approximation of the solution may be found even when the calculation is limited to considering only the contribution of the areas on the patterning device 30 within a limited region surrounding the point on the patterning device 30 that corresponds to a point of interest on the substrate. In other words, the effect of each point spread function taken into account may be limited to a portion of the substrate surrounding the point that corresponds to the area of the patterning device.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents. The application sets forth one or more, but not necessarily all, exemplary embodiments of the present invention as contemplated by the inventor(s), and thus, are not intended to limit the present invention and the appended claims in any way.

The invention claimed is:

1. A method comprising:
converting a representation of a pattern desired to be formed on a substrate into a plurality of area intensity signals, each corresponding to a radiation intensity level to be set in a respective area of a patterning device in a lithographic apparatus such that the effect at the substrate of the respective radiation intensity levels being set in each area of the patterning device is the desired pattern, the patterning device comprising a plurality of individually controllable elements that each may be set to either a first state, in which radiation is directed to a corresponding portion of the substrate, or a second state, in which radiation is not directed to a corresponding portion of the substrate;
converting each of the area intensity signals into a plurality of control signals for a respective plurality of individually controllable elements corresponding to the area of the patterning device such-that the individually controllable elements are set to appropriate states in order that the combined effect of setting all of the individually controllable elements in the area to the states in use is to provide the radiation intensity level for the area specified in the area intensity signal; and
setting each of the individually controllable elements according to its associated control signal.

2. The method according to claim 1, further comprising:
inspecting the substrate in order to determine at least one selected from: a distortion of the substrate from a nominal geometry or a position error of the substrate; and
determining the pattern desired to be formed on the substrate by modifying a nominal pattern desired to be formed on the substrate according to the distortion and/or position error of the substrate.

3. The method according to claim 2, wherein converting the representation of the pattern desired to be formed on the substrate into the plurality of area intensity signals includes modifying a nominal pattern desired to be formed on the substrate according to the distortion and/or position error of the substrate.

4. The method according to claim 1, wherein converting the representation of the pattern desired to be formed on the substrate into the plurality of area intensity signals uses a representation of the distribution of radiation intensity across the substrate derived from each area of the patterning device and determines the radiation intensity levels for each area of the patterning device such that, at each point on the substrate, the sum of the radiation received from each of the areas of the patterning device equals the respective radiation intensity for the point on the substrate in the pattern desired to be formed on the substrate.

5. The method according to claim 4, wherein the distribution of radiation intensity across the substrate derived from each area of the patterning device that is used is limited to a portion of the substrate surrounding a point on the substrate that corresponds to the center of the area of the patterning device.

6. The method according to claim 1, wherein converting the area intensity signals into the plurality of control signals takes into account known states of individually controllable elements that are non-responsive to control signals.

7. The method according to claim 1, wherein converting the area intensity signals into the plurality of control signals comprises selecting from a look-up table for each area intensity signal a corresponding set of control signals for the individually controllable elements in an area of the patterning device.

8. The method according to claim 1, wherein converting the area intensity signals into the plurality of control signals comprises:
  determining for each area of the patterning device, the number of individually controllable elements of the area to be set to the first state in order to provide the desired total radiation intensity at the corresponding portion on the substrate; and
  determining the control signals for the individually controllable elements of the area of the patterning device such that the number of individually controllable elements set to the first state are distributed across the area.

9. The method according to claim 8, wherein the individually controllable elements set to the first state are distributed across the area randomly, pseudo-randomly or evenly.

10. The method of claim 1, further:
  using the patterning device to impart a pattern to a beam of radiation; and
  projecting the beam of radiation onto the substrate.

11. A lithographic apparatus, comprising:
  a patterning device comprising a plurality of individually controllable elements used to impart a pattern to a beam of radiation;
  a projection system, configured to project the beam of radiation onto a substrate; and
  a controller, configured to:
    convert a representation of a pattern desired to be formed on a substrate into a plurality of area intensity signals, each corresponding to a radiation intensity level to be set in a respective area of the patterning device such that the effect at the substrate of the respective radiation intensity levels being set in each area of the patterning device is the desired pattern;
    convert each of the area intensity signals into a plurality of control signals for a respective plurality of individually controllable elements corresponding to the area of the patterning device such that the individually controllable elements are set to appropriate states in order that the combined effect of setting all of the individually controllable elements in the area to the states in use is to provide the radiation intensity level for the area; and
    provide the control signals to the individually controllable elements to set the state of each of the individually controllable elements.

12. The lithographic apparatus according to claim 11, further comprising a sensor configured to inspect the substrate in order to determine distortion of the substrate from a nominal geometry; and
  the controller is further configured to determine the pattern desired to be formed on the substrate by modifying a nominal pattern desired to be formed on the substrate according to the distortion of the substrate determined from the sensor.

13. The lithographic apparatus according to claim 11, wherein the controller is configured such that, when converting a representation of a pattern desired to be formed on a substrate into a plurality of area intensity signals, it uses a representation of the distribution of radiation intensity across the substrate derived from each area of the patterning device and determines the radiation intensity levels for each area of the patterning device such that, at each point on the substrate, the sum of the radiation received from each of the areas of the patterning device equals the respective radiation intensity for the point on the substrate in the pattern desired to be formed on the substrate.

14. The lithographic apparatus according to claim 13, wherein the distribution of radiation intensity across the substrate derived from each area of the patterning device that is used is limited to a portion of the substrate surrounding a point on the substrate that corresponds to the center of the area of the patterning device.

15. The lithographic apparatus according to claim 11, wherein the controller is configured to convert the area intensity signals into a plurality of control signals for a respective plurality of individually controllable elements taking into account known states of individually controllable elements that are non-responsive to control signals.

16. The lithographic apparatus according to claim 11, wherein the controller comprises a memory storing a look-up table relating possible area intensity signals to a corresponding set of control signals for the individually controllable elements of an area; and
  the controller is configured to convert the area intensity signals into a plurality of control signals using the look-up table.

17. The lithographic apparatus according to claim 11, wherein the controller is configured to convert the area intensity signals into a plurality of control signals for a respective plurality of individually controllable elements by:
  determining for each area of the patterning device, the number of individually controllable elements of the area to be set to the first state in order to provide the desired total radiation intensity at the corresponding portion on the substrate; and
  determining the control signals for the individually controllable elements of the area of the patterning device such that the number of individually controllable elements set to the first state are distributed across the area.

18. The lithographic apparatus according to claim 17, wherein the controller is configured such that the individually controllable elements set to the first state are distributed across the area randomly, pseudo randomly or evenly.

19. A computer program product comprising:
  a non-transitory computer readable storage medium comprising computer-readable program code embodied therewith, the computer readable program code comprising:
  computer readable program code configured to convert a representation of a pattern desired to be formed on a substrate into a plurality of area intensity signals, each corresponding to a radiation intensity level to be set in a respective area of a patterning device in a lithographic apparatus such that the effect at the substrate of the respective radiation intensity levels being set in each area of the patterning device is the desired pattern, the patterning device comprising a plurality of individually controllable elements that each may be set to either a first state, in which radiation is directed to a corresponding portion of the substrate, or a second state, in which radiation is not directed to a corresponding portion of the substrate; and computer readable program code configured to convert each of the area intensity signals into a plurality of control signals for a respective plurality of individually controllable elements corresponding to the area of the patterning device such that the individually controllable elements are set to appropriate states in order that the combined effect of setting all of the individually controllable elements in the area to the states in use is to provide the radiation intensity level for the area specified in the area intensity signal.

20. The computer program product of claim 19, wherein the computer readable program code configured to convert the representation of the pattern desired to be formed on the substrate into the plurality of area intensity signals is further configured to convert the representation of the pattern desired to be formed on the substrate into the plurality of area intensity signals using a representation of the distribution of radiation intensity across the substrate derived from each area of the patterning device and determine the radiation intensity levels for each area of the patterning device such that, at each point on the substrate, the sum of the radiation received from each of the areas of the patterning device equals the respective radiation intensity for the point on the substrate in the pattern desired to be formed on the substrate.

* * * * *